(12) United States Patent
Foong et al.

(10) Patent No.: US 9,269,659 B1
(45) Date of Patent: Feb. 23, 2016

(54) INTERPOSER WITH OVERMOLDED VIAS

(71) Applicants: Chee Seng Foong, Sungai Buloh (MY); Lan Chu Tan, Singapore (SG)

(72) Inventors: Chee Seng Foong, Sungai Buloh (MY); Lan Chu Tan, Singapore (SG)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/591,934

(22) Filed: Jan. 8, 2015

(51) Int. Cl.
| | |
|---|---|
| *H01L 23/49* | (2006.01) |
| *H01L 23/498* | (2006.01) |
| *H01L 21/48* | (2006.01) |
| *H01L 21/56* | (2006.01) |
| *H01L 21/288* | (2006.01) |
| *H01L 21/285* | (2006.01) |
| *H01L 25/00* | (2006.01) |
| *H01L 23/00* | (2006.01) |
| *H01L 25/065* | (2006.01) |

(52) U.S. Cl.
CPC ...... *H01L 23/49827* (2013.01); *H01L 21/2855* (2013.01); *H01L 21/2885* (2013.01); *H01L 21/486* (2013.01); *H01L 21/4842* (2013.01); *H01L 21/4857* (2013.01); *H01L 21/565* (2013.01); *H01L 23/49811* (2013.01); *H01L 23/49822* (2013.01); *H01L 23/49838* (2013.01); *H01L 24/17* (2013.01); *H01L 24/81* (2013.01); *H01L 25/0657* (2013.01); *H01L 25/50* (2013.01); *H01L 2224/16227* (2013.01); *H01L 2224/1703* (2013.01); *H01L 2224/81191* (2013.01); *H01L 2224/81801* (2013.01); *H01L 2225/06517* (2013.01); *H01L 2225/06548* (2013.01); *H01L 2225/06572* (2013.01); *H01L 2924/14* (2013.01)

(58) Field of Classification Search
CPC .............. H01L 23/49827; H01L 24/17; H01L 21/2885; H01L 21/2855; H01L 23/49838; H01L 23/49811; H01L 25/0657; H01L 25/50; H01L 23/49822; H01L 21/565; H01L 21/4857; H01L 21/4842; H01L 21/486
See application file for complete search history.

(56) References Cited

U.S. PATENT DOCUMENTS

| | | |
|---|---|---|
| 8,263,439 B2 | 9/2012 | Marimuthu |
| 8,411,459 B2 | 4/2013 | Yu |
| 8,581,402 B2 | 11/2013 | Yu |
| 2002/0127494 A1* | 9/2002 | Sturni et al. ......... C09D 5/4488 430/314 |
| 2012/0074585 A1 | 3/2012 | Koo |
| 2013/0029031 A1 | 1/2013 | Jeon |
| 2013/0242493 A1 | 9/2013 | Sheenoy |

* cited by examiner

*Primary Examiner* — Roy Potter
*Assistant Examiner* — Paul Patton
(74) *Attorney, Agent, or Firm* — Charles E. Bergere

(57) ABSTRACT

An interposer for a packaged semiconductor device is formed by applying an encapsulant to (e.g., by overmolding or applying lamination of tapes to) a perforated metal foil having vertical metal tabs that form the vertical metal vias in the interposer. A solid metal foil can be stamped using a microstamping tool to form the perforated foil and vertical tabs. Bump pads and/or re-distribution layer (RDL) traces are formed (e.g., using wafer fabrication processes or by applying flexible tape RDL layers) on the top and back sides of the foil to complete the manufacturing process. Such interposers can be cheaper to manufacture than conventional interposers having silicon or glass substrates with through-silicon vias (TSVs) formed using wafer fabrication processes.

18 Claims, 7 Drawing Sheets

INTERPOSER WITH OVERMOLDED VIAS

BACKGROUND OF THE INVENTION

The present invention relates generally to packaged semiconductor devices and, more particularly, to interposers for such devices.

An interposer is a component used in packaged semiconductor devices to route signals between ball grid arrays (BGAs) having different pitches.

FIG. 1 is a simplified, cross-sectional, side view of a conventional 2.5D (i.e., "2.5-dimensional") packaged semiconductor device 100 mounted on a circuit board 126. The packaged device 100 has two adjacent integrated circuit (IC) dies 102 mounted on and electrically interconnected with an interposer 110 via corresponding micro-bump ball grid arrays (BGAs) 104. The interposer 110 is, in turn, mounted onto and electrically interconnected with a system-in-package (SiP) substrate 122 via a corresponding flip-chip bump BGA 120. Similarly, the SiP substrate 122 is, in turn, mounted on and electrically interconnected with the circuit board 126 by way of a corresponding package bump BGA 124.

As represented in FIG. 1, the pitch of the micro-bump BGAs 104 between the dies 102 and the interposer 110 is smaller than the pitch of the flip-chip bump array 120 between the interposer 110 and the SiP substrate 122. To provide the signal fan-out associated with those two different pitches, the interposer 110 has a silicon or glass substrate 114 containing metal through-silicon vias (TSVs) 118 that provide electrical interconnections between metal features formed in top-side metal layers 112 on the top side of the substrate 114 and back-side metal layers 116 on the back side of the substrate 114. The metal features formed in the top-side and back-side metal layers 112 and 116 include bump pads (not explicitly shown) for the solder bumps of the BGAs 104 and 120 as well as re-distribution layer (RDL) traces (not explicitly shown) on either or both of the substrate sides that route signals horizontally to provide the signal fan-out.

Conventional 2.5D interposers, such as the interposer 110 of FIG. 1, having a glass or silicon substrate, are manufactured using a relatively expensive, wafer fabrication process involving masking, exposure, etching, and metallization steps to form the TSVs within the substrate. Accordingly, it would be advantageous to have a less expensive interconnect structure.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not been drawn to scale. For example, the thicknesses of layers and sizes of regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a", "an", and "the", are intended to include the plural forms as well, unless the context clearly indicates otherwise. It further will be understood that the terms "comprises", "comprising", "has", "having", "includes", or "including" specify the presence of stated features, steps, or components, but do not preclude the presence or addition of one or more other features, steps, or components. It also should be noted that, in some alternative implementations, the functions/acts noted might occur out of the order noted in the figures. For example, two figures shown in succession may in fact be executed substantially concurrently or may sometimes be executed in the reverse order, depending upon the functionality/acts involved. The term "or" is to be interpreted as inclusive unless indicated otherwise.

According to embodiments of the invention, instead of forming metal vias through a silicon or glass substrate using wafer fabrication processes, interposers are manufactured by stamping a metal foil to form vertical metal tabs extending from the resulting perforated foil. The perforated foil is then overmolded with a suitable molding compound to encapsulate the tabs in the resulting composite. Metal features such as bump pads and RDL (redistribution layer) traces are formed or applied to the top and back sides of the composite such that the encapsulated metal tabs function as vertical metal vias in the resulting interposer.

Figure 1:
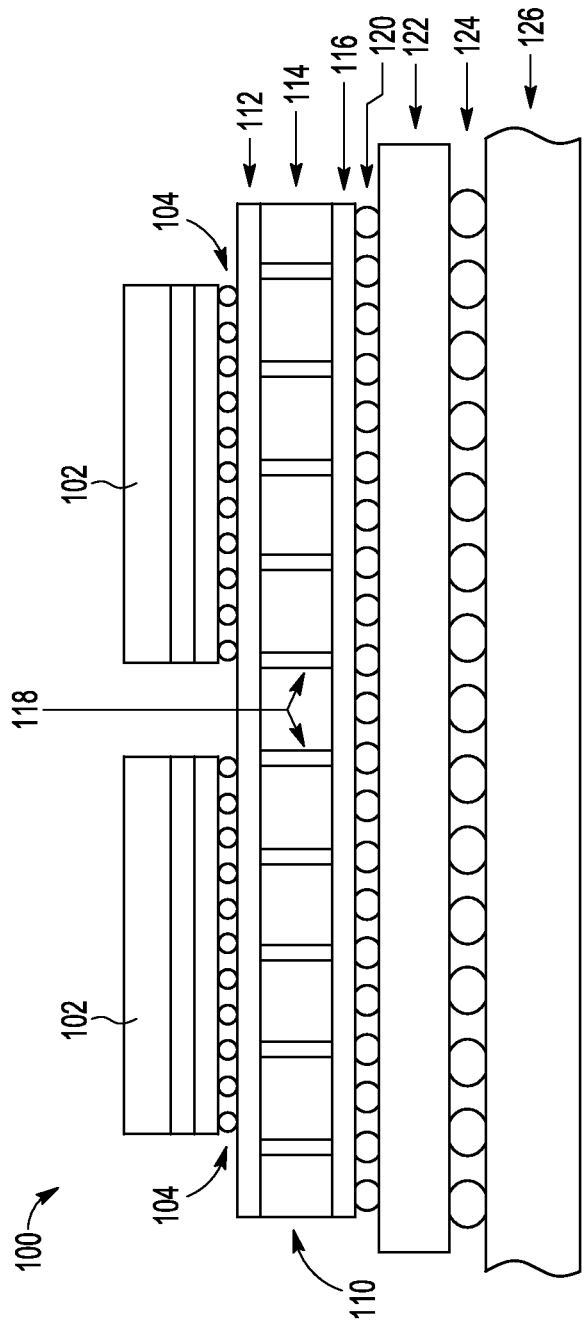
FIG. 1 is a simplified, cross-sectional, side view of a conventional 2.5D packaged semiconductor device mounted onto a circuit board.
Figure 2:
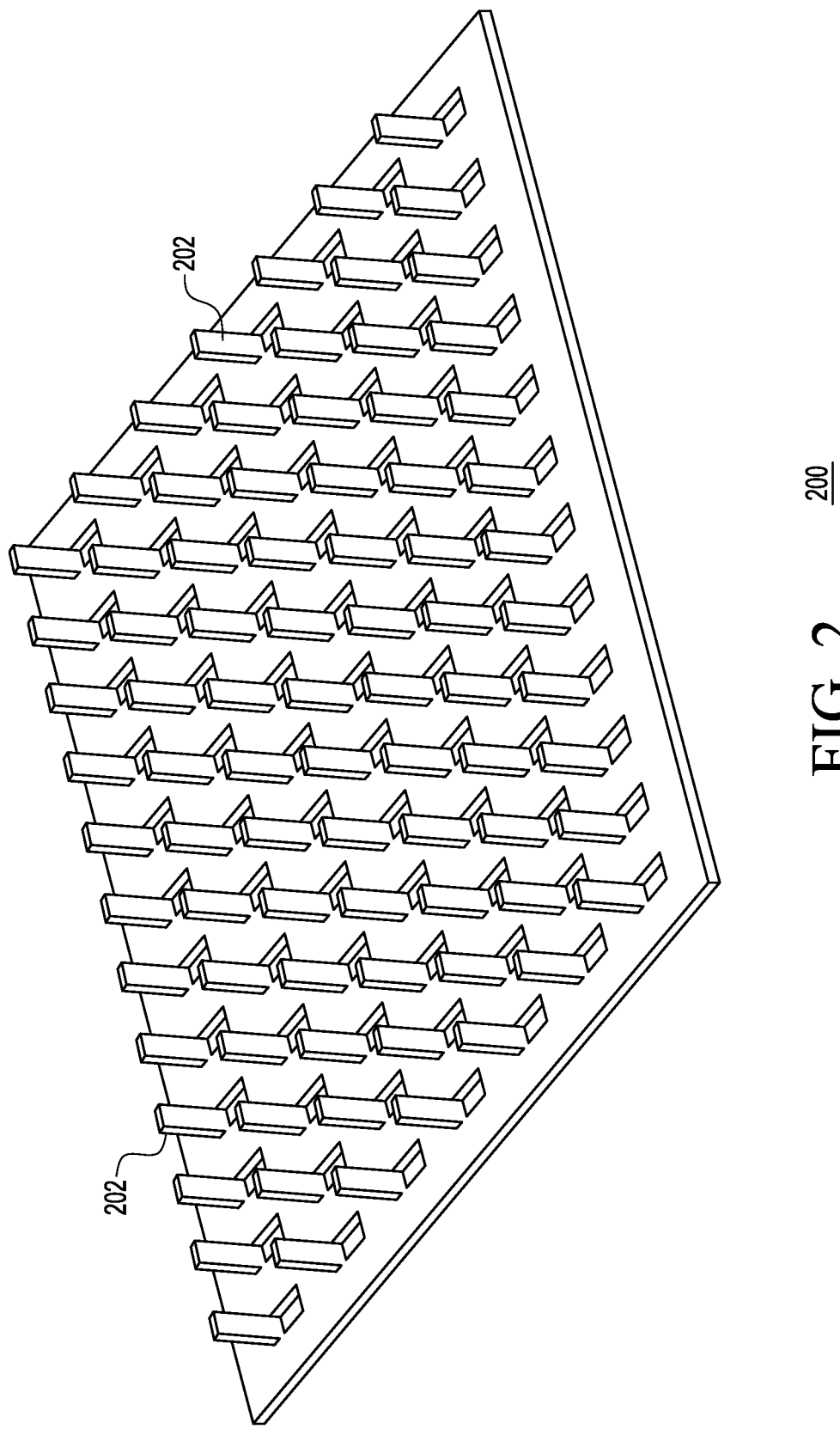
FIG. 2 is a simplified, isometric view of a perforated metal foil having a plurality of vertical metal tabs and that can be used to form an interposer in accordance with an embodiment of the present invention.

FIG. 2 is a simplified, isometric view of a perforated metal foil 200 having a plurality of vertical metal tabs 202 and which can be used to form an interposer of the present invention.

Figure 3A:
FIGS. 3A-3E are simplified, cross-sectional, side views illustrating steps in a process for forming the perforated metal foil of FIG. 2.
Figure 3B:
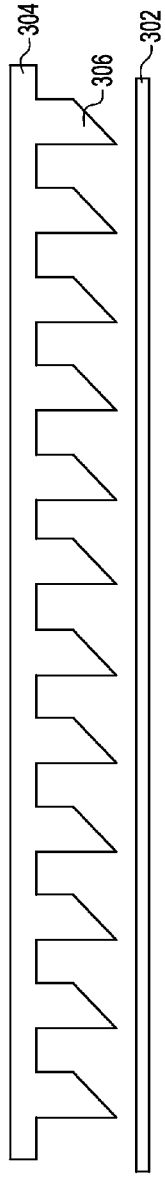
Figure 3C:
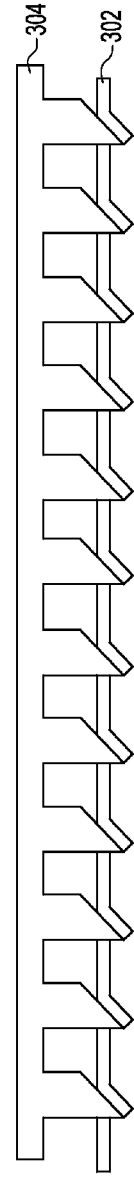
Figure 3D:
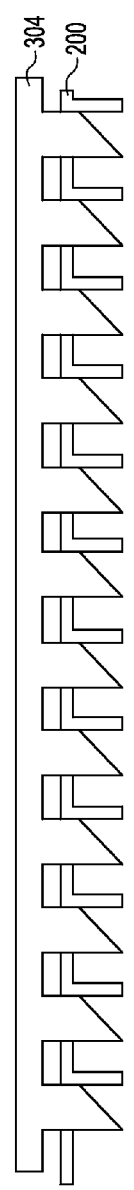
Figure 3E:
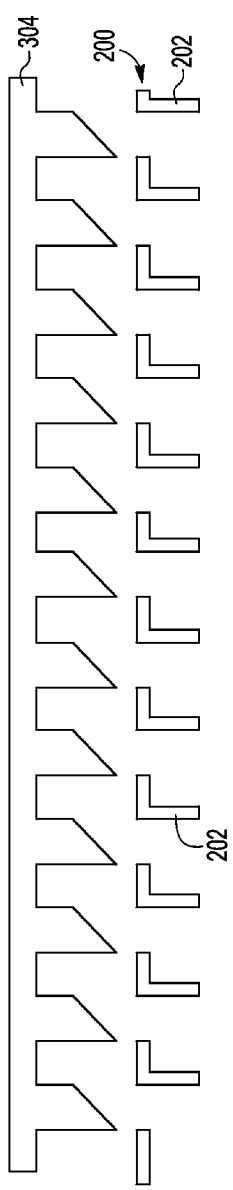

FIGS. 3A-3E are simplified, cross-sectional, side views representing a process for forming the perforated metal foil 200 of FIG. 2. The process begins in FIG. 3A with a blank metal (i.e., copper or other suitable material) foil 302. FIG. 3B shows a ganged micro-stamping tool 304 having appropriate teeth 306 being lowered towards the blank metal foil 302. FIG. 3C shows the micro-stamping tool 304 beginning to perforate the blank metal foil 302 and start to form the vertical metal tabs 202. FIG. 3D shows the micro-stamping tool 304 at the end of its perforation stroke. After the micro-stamping tool 304 has been retracted, FIG. 3E shows the resulting perforated foil 200 of FIG. 2 (upside down) having the vertical metal tabs 202.

Figure 4:
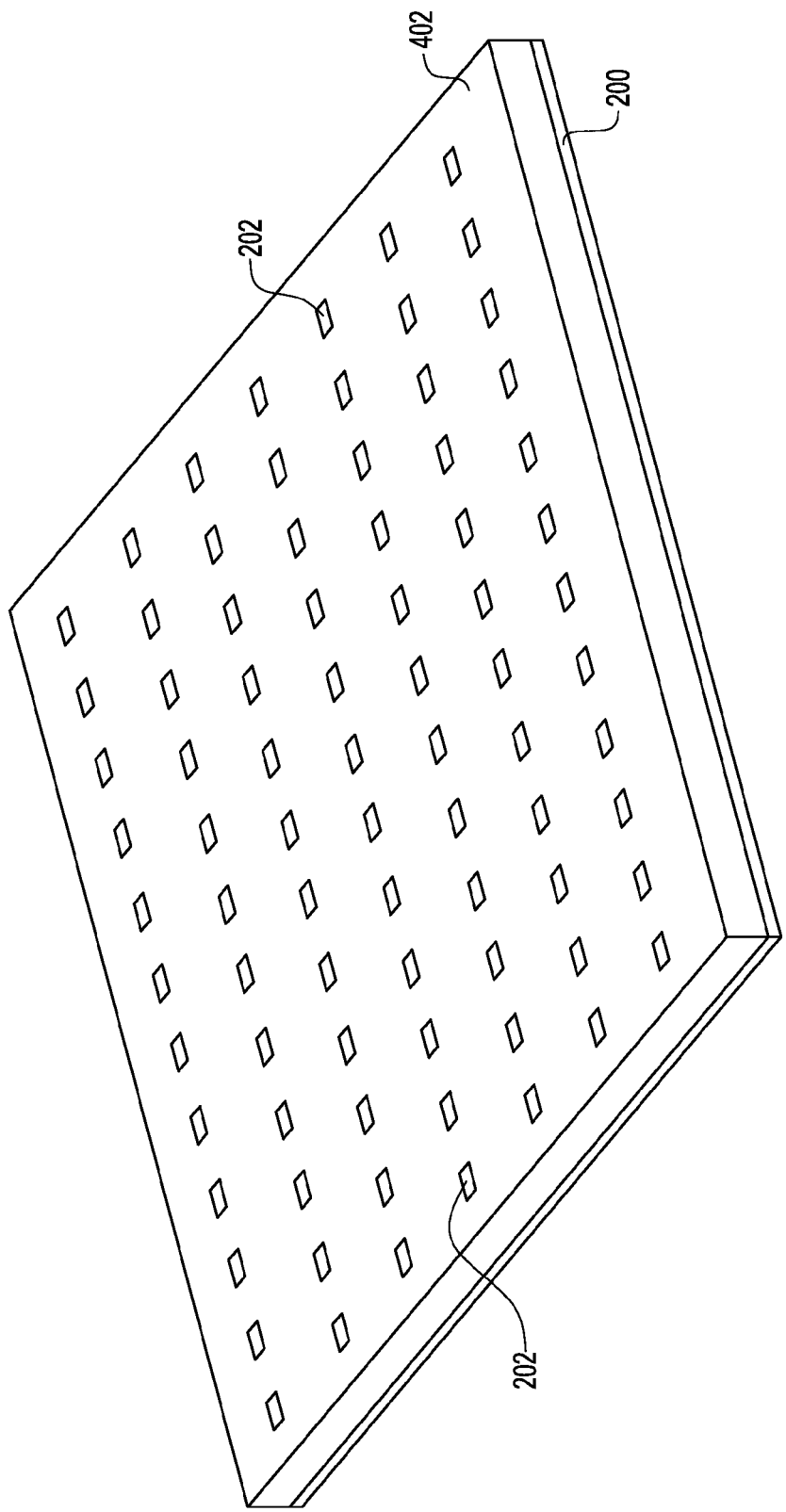
FIG. 4 is a simplified, isometric view of a composite that is produced by overmolding the perforated foil of FIG. 2 with a suitable (electrically insulating) molding compound.

FIG. 4 is a simplified, isometric view of the composite 400 that is produced by overmolding the perforated foil 200 of FIG. 2 with a suitable (electrically insulating) molding compound 402. Note that the top side of the composite 400 may need grinding after the overmolding step to expose the tips of the metal tabs 202. Although the composite 400 is produced by overmolding the perforated foil 200 with the molding compound 402, in other embodiments, other types of encapsulation with other types of encapsulant can be employed, such as (without limitation) by lamination with tape(s).

Figure 5:
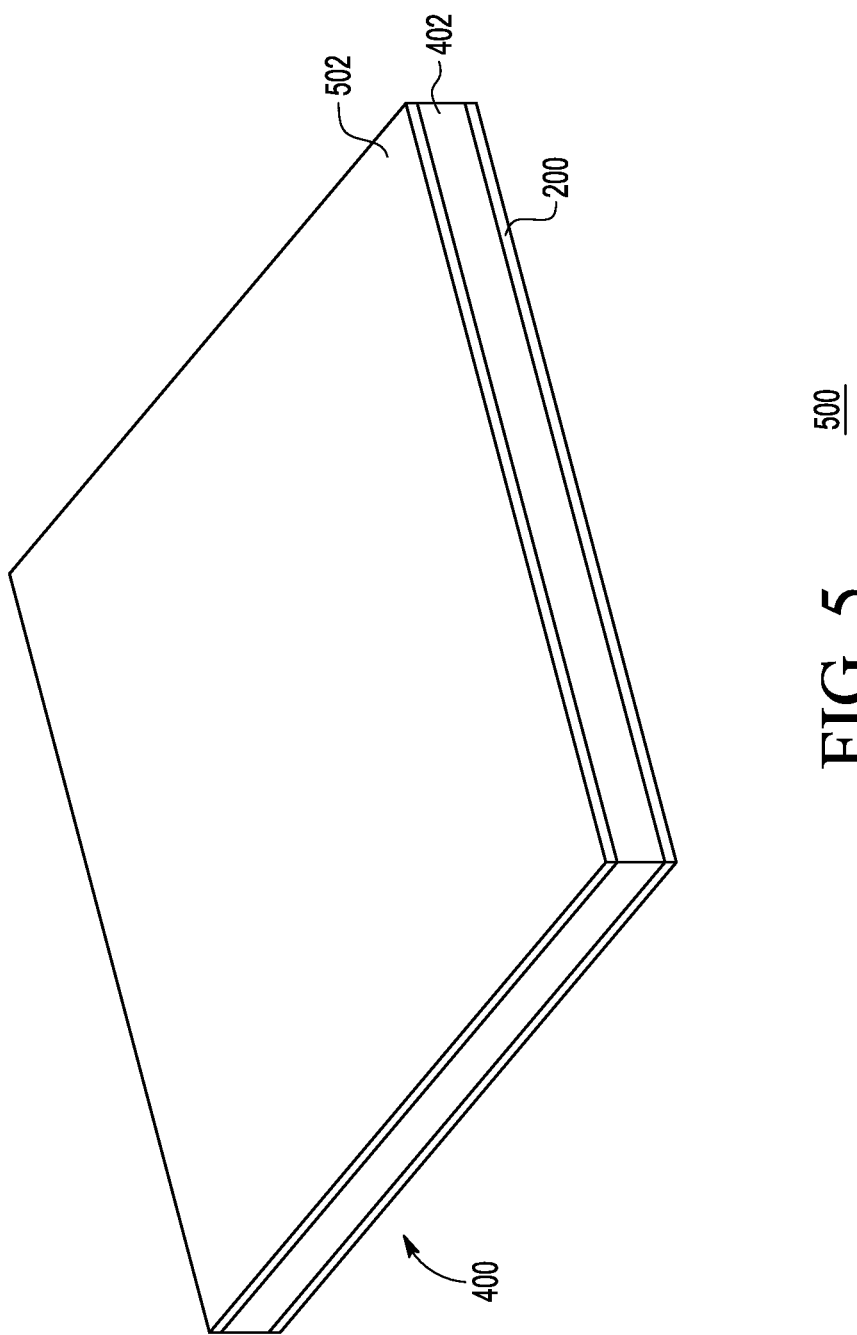
FIG. 5 is a simplified, isometric view of the composite that is produced by forming a top metal layer on the top side of the composite of FIG. 4.

FIG. 5 is a simplified, isometric view of the composite 500 that is produced by forming a top metal layer EB on the top side of the composite 400 of FIG. 4. Note that, in some implementations, the top metal layer EB is formed using a two-step process involving the sputtering of a thin metal layer onto the top side of the composite 400, followed by electrolytic and/or electroplating plating to increase the metal-layer thickness to form the top metal layer 502.

Figure 6A:
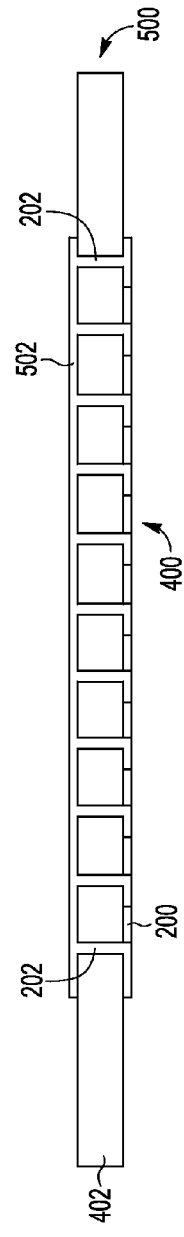
FIGS. 6A-6D are simplified, cross-sectional, side views illustrating a process for completing the manufacture of an interposer of the present invention from the composite of FIG. 5.
Figure 6B:
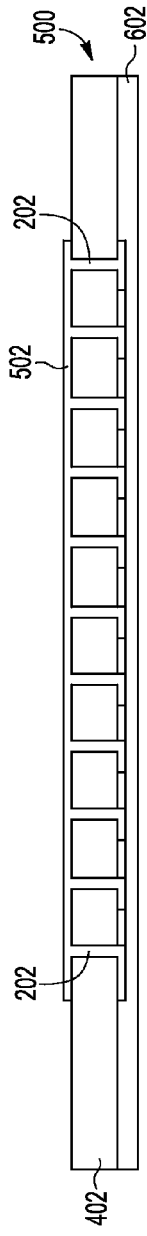

FIGS. 6A-6D are simplified, cross-sectional, side views representing a process for completing the manufacture of an interposer 600 of the present invention from the composite 500 of FIG. 5. The process begins at FIG. 6A with the composite 500. FIG. 6B represents the step of forming a back metal layer 602 on the back side of the composite 500. As with the top metal layer 502 on top side of the composite 500, the back metal layer 602 may be formed on the back side of the composite 500 using a two-step process involving sputtering followed by electroplating.

Figure 6C:
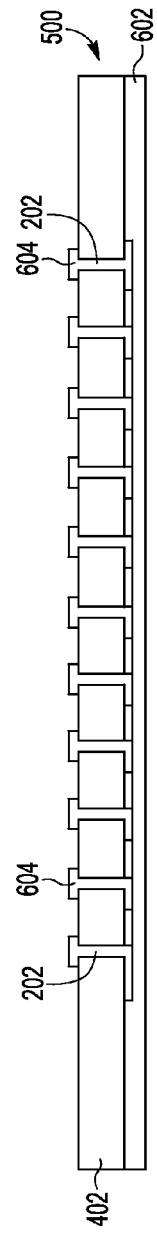
Figure 6D:
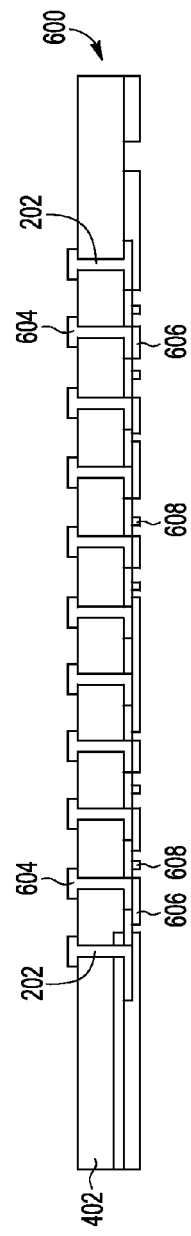

FIG. 6C represents the formation of chip-to-chip (C2C) bump pads 604 on the top side by masking, etching, and plating the metal layer 502. FIG. 6D represents the formation of C2C bump pads 606 and RDL traces 608 on the back side by masking, etching, and plating the metal layer FA to produce the interposer 600.

Figure 7:
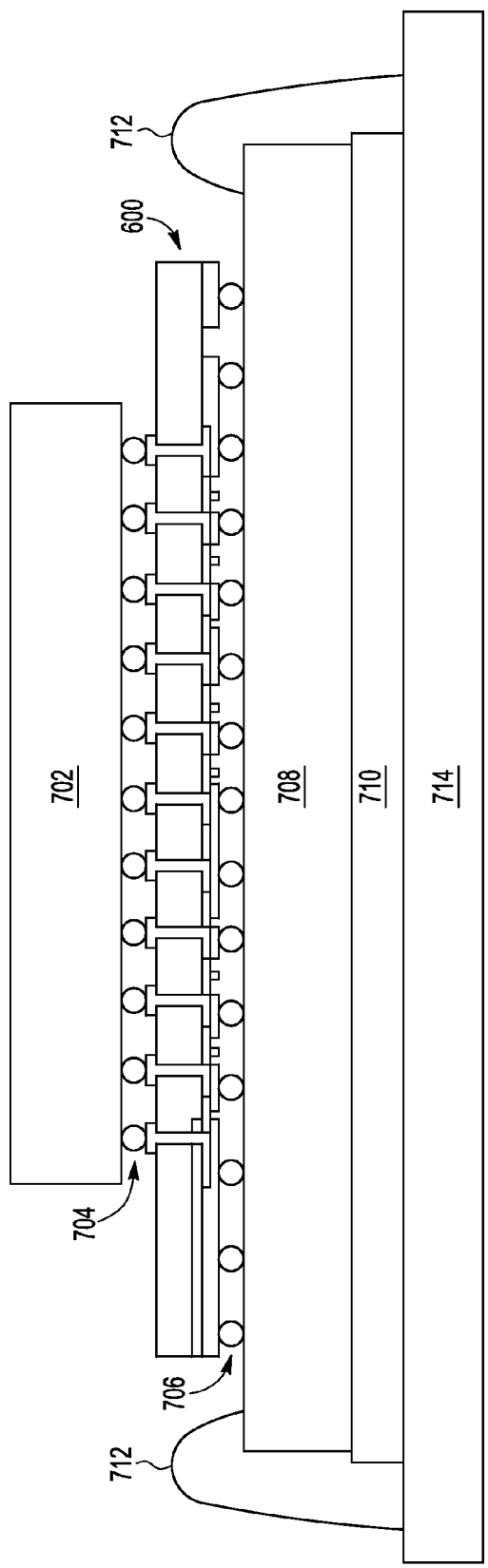
FIG. 7 is a simplified, cross-sectional, side view of an example, 2.5D packaged semiconductor device having the interposer of FIG. 6.

FIG. 7 is a simplified, cross-sectional, side view of an example, 2.5D packaged semiconductor device 700 having the interposer 600 of FIG. 6 providing the interconnection between a memory die 702 and a master-control unit (MCU) die 708. In particular, the interposer 600 routes signals between (i) the smaller-pitched BGA 704 associated with the memory die 702 and (ii) the larger-pitched BGA 706 associated with the MCU die 708, which is itself mounted onto and wire-bonded to a substrate 714 using a suitable epoxy 710 and bond wires 712.

Depending on the particular assembly process employed, the bumps of the BGAs 704 and 706 can be applied first to either the interposer 600 or the dies 702 and 708 before the components are mated using a suitable solder re-flow process. Although the invention has been described in the context of using solder balls to form the electrical connections between the interposer 600 and the dies 702 and 708, in other embodiments, the components can be connected using other means, such as (without limitation) copper pillar bumps or wire bonded stud bumps.

Those skilled in the art will understand that example packaged device 700 is just one possible application for the interposer 600 of FIG. 6, which can alternatively be used in many different packaged semiconductor device configurations.

Although the interposer 600 has only the bump pads 604 on its top side and the bump pads 606 and the RDL traces 608 on its back side, in general, interposers of the invention can have RDL traces on the top side in addition to or instead of the RDL traces 608 on the back side.

Because the vertical metal vias 202 of the interposer 600 are formed by overmolding the perforated foil 200 of FIGS. 2 and 3E rather than by applying wafer fabrication processes to a silicon or glass substrate, the interposer 600 can be manufactured with less cost than comparable interposers of the prior art.

Figure 8:
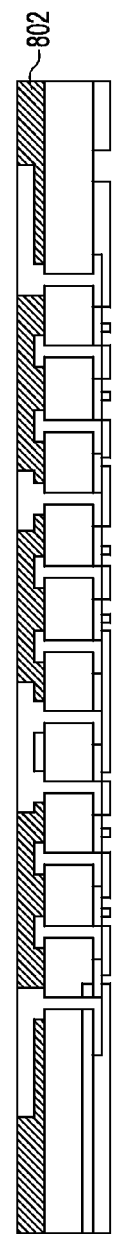
FIG. 8 is a simplified, cross-sectional, side view of an interposer according to an alternative embodiment of the invention.

FIG. 8 is a simplified, cross-sectional, side view of an interposer 800 according to an alternative embodiment of the invention. Instead of forming RDL traces and bump pads on a metal layer on the top side using wafer fabrication processes, the interposer 800 has, applied onto its top side, a flexible tape RDL layer 802, which is already pre-formed with appropriate RDL traces and bump pads. In such embodiments, the metallization step of FIG. 5 and the patterning step of FIG. 6C can be replaced with a single step of applying the flexible tape RDL layer 802 onto the top side of the composite 400 of FIG. 4.

In alternative embodiments, another flexible tape RDL layer could be applied onto the interposer's back side instead of or in addition to the flexible tape RDL layer 802 its top side. In such embodiments, the metallization step of FIG. 6B and the patterning step of FIG. 6D can replaced by the steps of (i) removing the metal layer at the back side of the composite 400 of FIG. 4 to expose the lower ends of the vertical metal vias 202 and (ii) then applying the other flexible tape RDL layer onto the back side of the resulting composite.

Using such flexible tape RDL layers instead of forming metal features, such as bump pads and RDL traces, using wafer fabrication processes can further reduce the cost of manufacturing interposers of the invention.

It should be understood that the steps of the exemplary method set forth herein are not necessarily required to be performed in the order described, and the order of the steps of such method should be understood to be merely exemplary. Likewise, additional steps may be included in such method, and certain steps may be omitted or combined, in such method consistent with various embodiments of the invention.

Although the invention has been described using relative terms such as "front", "back", "top", "bottom", "over", "above", "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used in the claims to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A method, comprising:
    (a) perforating a metal foil to form vertical metal tabs extending from the perforated foil;
    (b) applying an encapsulant to the perforated foil to encapsulate the vertical metal tabs; and
    (c) providing metal features on top and back sides of the perforated foil to produce an interposer.

2. The method of claim 1, wherein step (a) comprises stamping the metal foil using a micro-stamping tool to form the perforated foil.

3. The method of claim 1, wherein step (b) comprises overmolding the perforated foil with a molding compound to encapsulate the vertical metal tabs.

4. The method of claim 3, wherein step (b) further comprises grinding the overmolded perforated foil to expose upper ends of the vertical metal tabs.

5. The method of claim 1, wherein step (b) comprises laminating the perforated foil with tape to encapsulate the vertical metal tabs.

6. The method of claim 1, wherein step (c) comprises:
    (c1) forming a top metal layer on the top side of the perforated foil; and
    (c2) patterning the top metal layer to form the metal features on the top side of the perforated foil.

7. The method of claim 6, wherein step (c1) comprises: sputtering a thin metal layer onto the top side of the perforated foil; and
    electroplating the thin metal layer to form the top metal layer on the top side of the perforated foil.

8. The method of claim 6, wherein step (c2) comprises applying wafer fabrication processes to the top metal layer to form the metal features on the top side of the perforated foil.

9. The method of claim 1, wherein step (c) comprises applying flexible tape re-distribution layer (RDL) layers onto the top side of the perforated foil.

10. The method of claim 1, wherein step (c) comprises:
    plating the back side of the perforated foil with a back metal layer; and
    applying wafer fabrication processes to the back metal layer to form the metal features on the back side of the perforated foil.

11. The method of claim 1, wherein:
    the metal features on the top side comprise bump pads; and
    the metal features on the back side comprise bump pads.

12. The method of claim 11, wherein the metal features on at least one of the top side and the back side comprise RDL traces.

13. The method of claim 1, further comprising:
    (d) assembling a packaged semiconductor device using the interposer, wherein the interposer interconnects (i) a first device component connected to the top side of the interposer and (ii) a second device component connected to the back side of the interposer.

14. The method of claim 13, wherein the interposer is interconnected to the first and second components using respective first and second ball grid arrays of solder balls having different pitch.

15. The method of claim 13, wherein at least one of the first component and the second component is an integrated circuit (IC) die.

16. The method of claim 15, wherein both the first component and the second component are IC dies.

17. The interposer manufactured using the method of claim 1.

18. The packaged semiconductor device assembled using the method of claim 13.

* * * * *